United States Patent [19]
Wang et al.

[11] Patent Number: 6,096,651
[45] Date of Patent: Aug. 1, 2000

[54] KEY-HOLE REDUCTION DURING TUNGSTEN PLUG FORMATION

[75] Inventors: Mei-Yun Wang; Chen-Hua Yu, both of Hsin-chu; Shau-Lin Shue, Hsinchu, all of Taiwan

[73] Assignee: Taiwan Semiconductor Manufacturing Company, Hsin-Chu, Taiwan

[21] Appl. No.: 09/228,126

[22] Filed: Jan. 11, 1999

[51] Int. Cl.[7] .................................................. H01L 21/302
[52] U.S. Cl. .......................... 438/691; 438/700; 438/701; 438/710
[58] Field of Search .................................... 438/710, 691, 438/700, 701

[56] References Cited

U.S. PATENT DOCUMENTS

| | | | |
|---|---|---|---|
| 4,903,117 | 2/1990 | Okamoto et al. | 357/71 |
| 4,956,313 | 9/1990 | Cote et al. | 437/203 |
| 5,313,100 | 5/1994 | Ishii et al. | 257/751 |
| 5,488,014 | 1/1996 | Harada et al. | 437/192 |
| 5,521,119 | 5/1996 | Chen et al. | 437/187 |
| 5,658,829 | 8/1997 | Mathews et al. | 438/656 |
| 5,888,901 | 3/1999 | Grivna | 438/637 |

*Primary Examiner*—Benjamin L. Utech
*Assistant Examiner*—Vanessa Perez-Ramos
*Attorney, Agent, or Firm*—George O. Saile; Stephen B. Ackerman

[57] ABSTRACT

The problem of key-hole formation during the filling of small diameter via holes has been overcome by means of soft sputtering in argon after the barrier layer is in place. This sputtering step may be used twice—once to widen the mouth of a newly formed via hole, and a second time after the barrier layer is in place, thereby widening the mouth further (as well as removing oxide from the surface of the barrier layer). In an alternate optional embodiment, widening of the via hole mouth may be limited to a single sputtering step after the barrier layer has been laid down. In either case, this is followed by filling of the via hole which occurs without any key-hole formation.

20 Claims, 3 Drawing Sheets

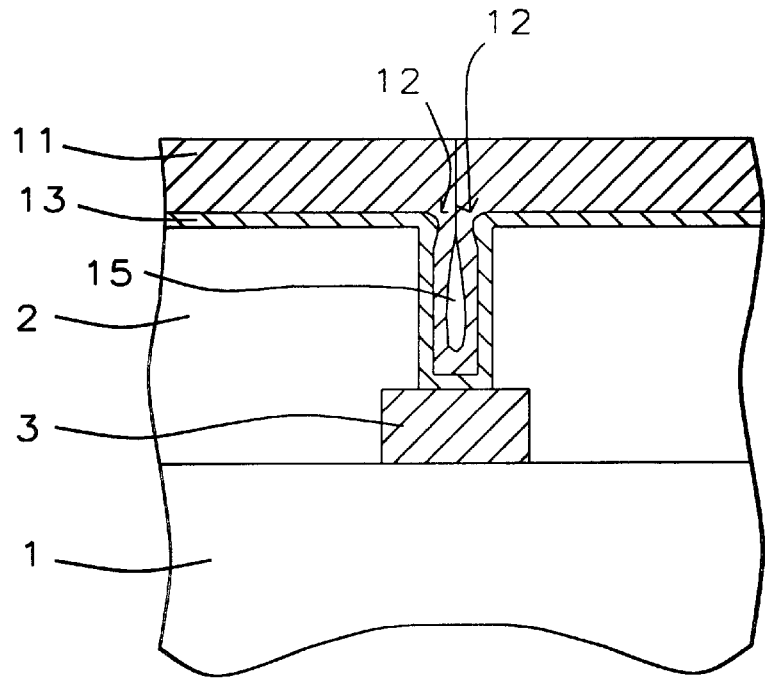
FIG. 1 – Prior Art
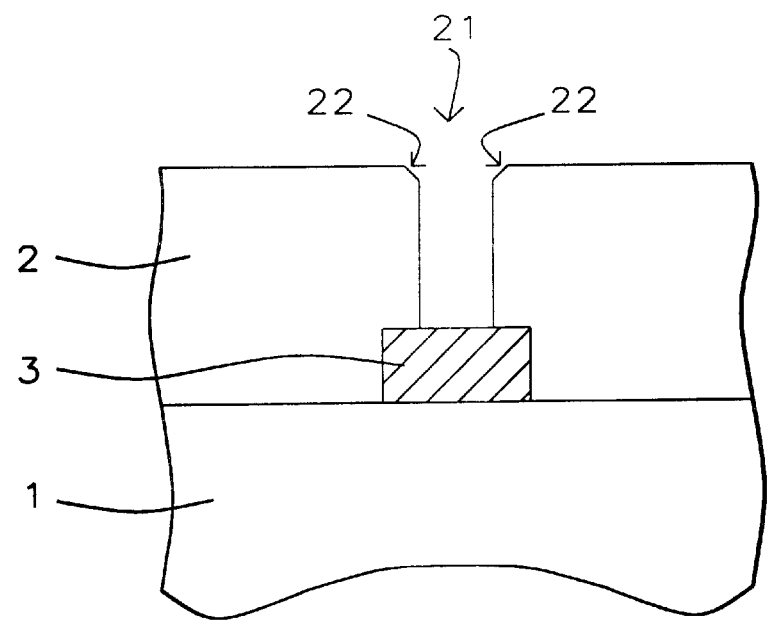
FIG. 2

KEY-HOLE REDUCTION DURING TUNGSTEN PLUG FORMATION

FIELD OF THE INVENTION

The invention relates to the general field of interconnections in integrated circuits with particular reference to filling via holes with tungsten plugs.

BACKGROUND OF THE INVENTION

It is common practice in the design of integrated circuits to connect different levels of metalization through via holes filled with tungsten plugs. As the dimensions in integrated circuits continue to shrink, the diameters of these via holes are similarly reduced. In general, the minimum separation between metal levels has not decreased at the same relative rate as have the diameters. As a consequence, the aspect ratio of a typical via hole can be quite high with values of the order of 10:1 not being unusual.

Proper filling of a via hole of narrow diameter (less about 0.3 microns) and high aspect ratio can present significant difficulties. In FIG. 1 we illustrate the kind of problem that can arise. Metal layer 3 (usually a line interconnection pattern shown in this case as running into the plane of the figure) is seen to be resting on silicon substrate 1. It has been covered by dielectric layer 2, its top surface planarized and a via hole etched through it down to the level of the metal. Barrier layer 13 was then deposited to act as a liner for the via hole which was then over-filled with tungsten layer 11.

Because of the small diameter of the via hole, when barrier layer 13 was laid down small cusps 12 built up at the mouth of the via hole. Then, while the tungsten was being deposited, the mouth of the via hole got bridged by metal before it could be entirely filled. The result of this was formation of void 15, commonly referred to as a key-hole. The presence of voids such as 15 cannot be allowed since the effective conductance of the tungsten plug is reduced and, more seriously, when tungsten layer 11 is later etched back (typically by means of chemical mechanical polishing or CMP) the key-hole gets exposed to the etch front and large amounts of plug material may be removed before the structure has been planarized.

In order to overcome this problem of key-hole formation, it has become common practice to widen the mouth of the via hole prior to the deposition of the tungsten. This not only removes protruding cusps such as 12 in FIG. 1 but serves also to widen the via hole at its mouth by beveling the edges. For example, Matthews et al. (U.S. Pat. No. 5,658,829) teach such a process. To accomplish this they make use of 'facet' etching which is a process where the etchant that is used attacks both the photoresist as well as the dielectric layer, although significantly more slowly. Thus, while the depth of the etched hole is increasing, the diameter of the photoresist mask is also slowly increasing, resulting in a beveled edge to the via hole. Note that this method requires that the widening of the via hole take place before the barrier layer is deposited.

Other references of interest that were encountered during a routine search of the prior art include Ishii et al. (U.S. Pat. No. 5,313,100) who teach the use of anti-reflection coatings during the formation of the via holes. Additionally, their structure includes a rounded opening. Also of interest was Chen (U.S. Pat. No. 5,521,119) whose patent addresses the problem of contamination of the tungsten plug at the end of the CMP process. Contaminants formed in this way are removed through a post treatment involving argon ion sputtering.

SUMMARY OF THE INVENTION

It has been an object of the present invention to provide a process for forming and then filling a via hole in an integrated circuit.

Another object of the present invention has been that said process not introduce a key hole structure as a side effect.

These objects have been achieved by performing soft sputtering in argon after the barrier layer is in place. This sputtering step may be used twice—once to widen the mouth of a newly formed via hole, and a second time after the barrier layer is in place, thereby widening it further (as well as removing oxide from the surface of the barrier layer). In an alternate optional embodiment, widening of the via hole mouth may be limited to a single sputtering step after the barrier layer has been laid down. In either case this is followed by filling of the via hole which occurs without any key-hole formation.

BRIEF DESCRIPTION OF THE DRAWINGS

FIG. 1 shows how a key-hole structure may get formed when a via whole is filled with a conductive plug.

FIG. 2 illustrates the first step for the process of the present invention.

DESCRIPTION OF THE PREFERRED EMBODIMENTS

Figure 3:
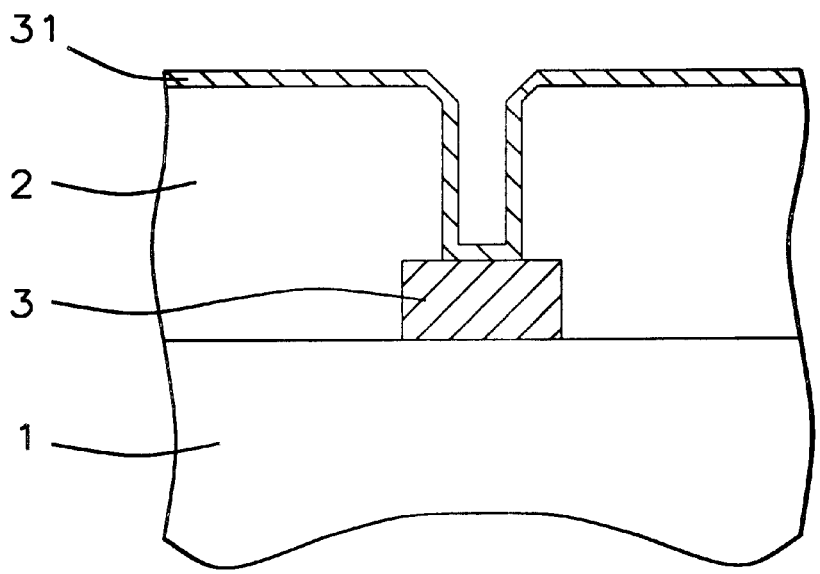
FIG. 3 shows a via hole with beveled edges and a barrier layer lining.

We begin a description of the process of the present invention by referring to FIG. 2. Metal layer 3 has been deposited and patterned on the surface of silicon substrate 1 and then covered with dielectric layer 2. To form the via hole, photoresist was deposited on the surface of 2, exposed through a reticle, and then developed to form a suitable mask. With this mask in place, via hole 21 was then etched through layer 2 down to the level of metal layer 3. The via hole has a diameter between about 0.1 and 0.5 microns while its depth is between about 0.5 and 3 microns.

All photoresist was then stripped from the surface of layer 2.

In a first embodiment of the invention, the structure of FIG. 2 was sputter etched so that a small amount (between about 50 and 250 Angstroms) of layer 2 was removed. At the same time the mouth of the via hole 21 was widened as result of the formation of beveled surfaces 22. Sputter etching at this stage was performed in argon at a pressure between about 0.1 and 1 mtorr and a power level between about 100 and 500 watts for between about 6 and 30 seconds.

Next, barrier layer 31 was deposited to a thickness between about 50 and 1,000 Angstroms in order to provide a conformal coating over the surface of layer 2 including the walls and base of via hole 21, giving the structure the appearance illustrated in FIG. 3. Most commonly we used titanium nitride for the barrier layer but other materials, such as titanium, tantalum, tantalum nitride, or titanium-tungsten, could also have been used.

Figure 4:
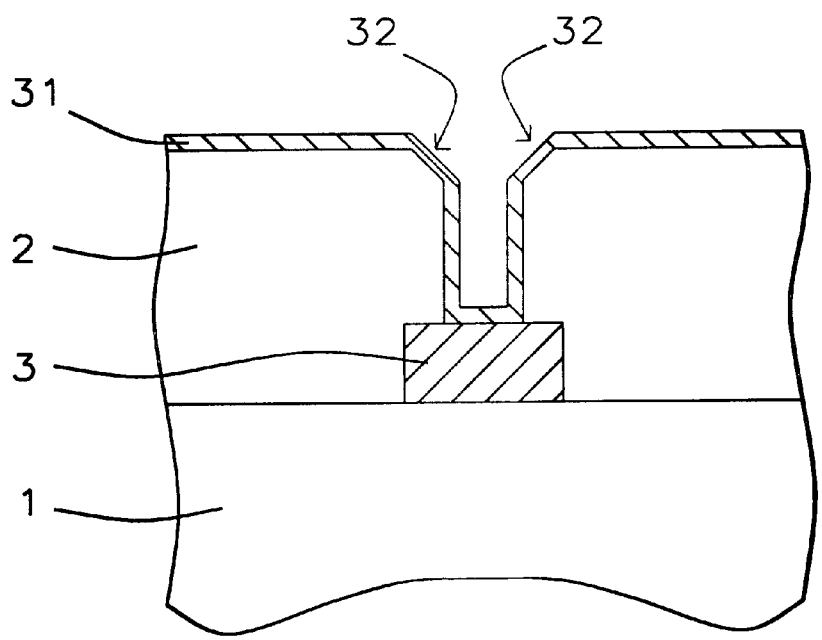
FIG. 4 illustrates how the beveling may be further enhanced by using a low energy argon sputtering step.
Figure 5:
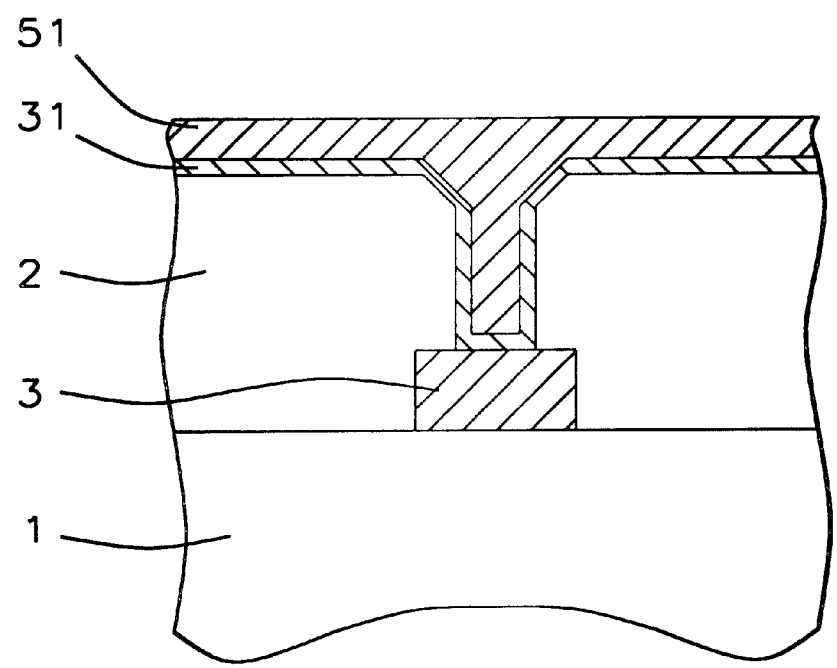
FIG. 5 shows the structure of FIG. 4 after over filling with tungsten, illustrating the absence of any key hole.

In a key feature of the invention, once the barrier layer was in place, a second sputter etching step was introduced. This had the dual effect of further widening the mouth of the via hole, producing even more pronounced bevels than before (shown as 32 in FIG. 4), and removing a thin oxide layer that inevitably grew on the surface of the barrier layer between the time that it was laid down and the time that tungsten was deposited. While not influencing possible key-hole formation, this side effect of the second sputter etching step helped lower the contact resistance between the tungsten plug and the metal line. Sputter etching during this phase was performed in argon at a pressure between about 0.1 and 1 mtorr and a power level between about 100 and 500 watts for between about 6 and 30 seconds. The amount of barrier layer material that was removed during the second sputtering step was between about 10 and 300 Angstroms As seen in FIG. 5, the via hole is initially over-filled with tungsten layer 51. Deposition of the tungsten was accomplished by means of chemical vapor deposition (CVD) —at a substrate temperature less than about 470° C., a nucleating layer was first deposited between about 4 and 40 torr of pressure, following which the remaining metal was deposited at less than about 100 torr. In general, the thickness of the tungsten layer, as deposited, was between about 0.2 and 0.8 microns.

Removal of tungsten not in the via hole was then achieved by means of CMP.

In an optional second embodiment of the invention, sputter etching is performed only once. In this case, no attempt is made to widen the mouth of the hole prior to the deposition of the barrier layer. Instead, after the via hole has been formed in the conventional manner described above, the process proceeds directly to that which is illustrated in FIG. 4. The single sputter etching step used in this embodiment was performed in argon at a pressure between about 0.1 and 1 mtorr and a power level between about 100 and 500 watts for between about 6 and 30 seconds. The amount of barrier layer material that was removed during this single sputtering step was between about 50 and 400 Angstroms.

A key feature of the second embodiment (as in the first embodiment) is that widening of the via hole to any extent must not occur until the barrier layer is in place. This is a marked departure from the prior art. What we have found is that if the widening sputter etch step is performed before the barrier layer is in place, metal (from layer 3) deposits on the walls of the via hole. This metal can later reduce the effectiveness of the barrier layer.

While the invention has been particularly shown and described with reference to the preferred embodiments thereof, it will be understood by those skilled in the art that various changes in form and details may be made without departing from the spirit and scope of the invention.

What is claimed is:

1. A process for filling a via hole, comprising the sequential steps of:
    providing a partially completed integrated circuit, including a metal layer covered by a dielectric layer;
    coating the dielectric layer with a layer of photoresist which is then exposed through a reticle and developed to form a mask;
    through said mask, etching the dielectric layer down to the level of said metal layer, thereby forming a via hole having a mouth and walls;
    stripping away all photoresist;
    performing a first sputter etch whereby an amount of dielectric material is removed and the mouth of said via hole is widened;
    depositing a barrier layer that lines the walls of the via hole;
    performing second sputter etch whereby an amount of barrier layer material is removed and said mouth of the via hole is further widened; and
    filling said via hole with tungsten.

2. The process of claim 1 wherein the via hole has a diameter between about 0.1 and 0.5 microns.

3. The process of claim 1 wherein the via hole has a depth between about 0.5 and 3 microns.

4. The process of claim 1 wherein the step of performing a first sputter etch further comprises sputter etching with argon at a pressure between about 0.1 and 1 mtorr, and a power level between about 100 and 500 watts for between about 6 and 30 seconds.

5. The process of claim 4 wherein the amount of dielectric material that is removed is between about 50 and 250 Angstroms.

6. The process of claim 1 wherein the barrier layer is selected from the group consisting of titanium nitride, titanium, tantalum, tantalum nitride, and titanium-tungsten.

7. The process of claim 1 wherein the step of performing a second sputter etch further comprises sputter etching with argon at a pressure between about 0.1 and 1 mtorr, and a power level between about 100 and 500 watts for between about 6 and 30 seconds.

8. The process of claim 7 wherein the amount of barrier layer material that is removed is between about 10 and 300 Angstroms.

9. The process of claim 1 wherein the step of filling the via hole with tungsten further comprises:
    depositing by means of chemical vapor deposition at a substrate temperature less than about 470° C. and at a pressure between about 4 and 40 torr, to form a nucleating layer; and
    then depositing all remaining metal at a pressure that is less than about 100 torr.

10. The process of claim 1 wherein said barrier layer has a thickness between about 50 and 1,000 Angstroms.

11. The process of claim 1 wherein the tungsten is deposited to a thickness between about 2,000 and 8,000 Angstroms thereby, overfilling the via hole.

12. A process for filling a via hole, comprising the sequential steps of:
    providing a partially completed integrated circuit, including a metal layer covered by a dielectric layer;
    coating the dielectric layer with a layer of photoresist which is exposed through a reticle and then developed to form a mask;
    through said mask, etching the dielectric layer down to the level of said metal layer, thereby forming a via hole having a mouth and walls;
    stripping away all photoresist;
    depositing a barrier layer that lines the walls of the via hole;
    performing a sputter etch of the dielectric layer whereby an amount of barrier layer material is removed and said mouth of the via hole is widened; and
    filling said via hole with tungsten.

13. The process of claim 12 wherein the via hole has a diameter between about 0.1 and 0.5 microns.

14. The process of claim 12 wherein the via hole has a depth between about 0.5 and 3 microns.

15. The process of claim 12 wherein the step of performing a sputter etch further comprises sputter etching with argon at a pressure between about 0.1 and 1 mtorr, and a power level between about 100 and 500 watts for between about 6 and 30 seconds.

16. The process of claim 15 wherein the amount of barrier layer material that is removed is between about 50 and 400 Angstroms.

17. The process of claim 12 wherein the barrier layer is selected from the group consisting of titanium nitride, titanium, tantalum, tantalum nitride, and titanium-tungsten.

18. The process of claim 12 wherein said barrier layer has a thickness between about 50 and 1,000 Angstroms.

19. The process of claim 12 wherein the tungsten is deposited to a thickness between about 0.2 and 0.8 microns thereby, overfilling the via hole.

20. The process of claim 19 further comprising removing tungsten through chemical-mechanical polishing until said via hole is only just filled with tungsten.

* * * * *